United States Patent
Kirk et al.

(10) Patent No.: US 12,148,575 B2
(45) Date of Patent: Nov. 19, 2024

(54) INTEGRATED COMPONENT INCLUDING A CAPACITOR AND DISCRETE VARISTOR

(71) Applicant: AVX Corporation, Fountain Inn, SC (US)

(72) Inventors: Michael W. Kirk, Simpsonville, SC (US); Marianne Berolini, Greenville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 456 days.

(21) Appl. No.: 16/850,142

(22) Filed: Apr. 16, 2020

(65) Prior Publication Data
US 2020/0343051 A1    Oct. 29, 2020

Related U.S. Application Data

(60) Provisional application No. 62/838,410, filed on Apr. 25, 2019.

(51) Int. Cl.
*H01G 4/40* (2006.01)
*H01G 4/12* (2006.01)
(Continued)

(52) U.S. Cl.
CPC ............. *H01G 4/40* (2013.01); *H01G 4/12* (2013.01); *H01G 4/228* (2013.01); *H01G 4/35* (2013.01); *H01L 27/0682* (2013.01)

(58) Field of Classification Search
CPC ............ H01G 4/40; H01G 4/12; H01G 4/228; H01G 4/38; H01G 4/30; H01G 4/232;
(Continued)

(56) References Cited

U.S. PATENT DOCUMENTS

| | | | | |
|---|---|---|---|---|
| 4,811,164 A | * | 3/1989 | Ling | H01G 4/40 |
| | | | | 338/21 |
| 4,853,826 A | | 8/1989 | Hernandez | |

(Continued)

FOREIGN PATENT DOCUMENTS

| | | | | |
|---|---|---|---|---|
| AU | 2010100764 A4 | * | 9/2010 | ............... H05C 3/00 |
| EP | 2947757 A1 | * | 11/2015 | ............... H01G 4/38 |

(Continued)

OTHER PUBLICATIONS

International Search Report and Written Opinion for PCT/US2020/028740, dated Jul. 31, 2020, 11 pages.

(Continued)

*Primary Examiner* — David M Sinclair
*Assistant Examiner* — Daniel M Dubuisson
(74) *Attorney, Agent, or Firm* — Dority & Manning, P.A.

(57) ABSTRACT

An integrated component may include a multilayer capacitor include a first active termination, a second active termination, at least one ground termination, and a pair of capacitors connected in series between the first active termination and the second active termination. The integrated component may include a discrete varistor comprising a first external varistor termination connected with the first active termination and a second external varistor termination connected with the second active termination of the multilayer capacitor.

24 Claims, 11 Drawing Sheets

(51) Int. Cl.
*H01G 4/228* (2006.01)
*H01G 4/35* (2006.01)
*H01L 27/06* (2006.01)

(58) Field of Classification Search
CPC ...... H01G 4/385; H01L 27/0682; H01C 7/12; H01C 7/10; H01C 7/1006; H01C 7/1013; H01C 7/18
See application file for complete search history.

(56) References Cited

U.S. PATENT DOCUMENTS

| | | | |
|---|---|---|---|
| 5,034,709 A * | 7/1991 | Azumi | H01C 7/112 |
| | | | 29/610.1 |
| 5,146,200 A | 9/1992 | Heilmann et al. | |
| 5,815,367 A * | 9/1998 | Asakura | H01G 4/40 |
| | | | 333/204 |
| 5,870,273 A | 2/1999 | Sogabe et al. | |
| 6,433,992 B2 | 8/2002 | Nakagawa et al. | |
| 6,473,291 B1 | 10/2002 | Stevenson | |
| 8,315,033 B2 | 11/2012 | Takashima et al. | |
| 8,884,720 B2 | 11/2014 | Kanno et al. | |
| 8,885,324 B2 | 11/2014 | Bultitude et al. | |
| 9,076,596 B2 | 7/2015 | Yoon et al. | |
| 9,171,672 B2 | 10/2015 | McConnell et al. | |
| 9,455,086 B2 | 9/2016 | Shimada et al. | |
| 10,064,281 B2 | 8/2018 | Fujii | |
| 10,192,682 B1 * | 1/2019 | Park | H01G 4/232 |
| 10,395,833 B2 | 8/2019 | Shimada et al. | |
| 10,607,777 B2 | 3/2020 | Kirk et al. | |
| 10,687,814 B2 * | 6/2020 | Bultitude | H01L 23/49838 |
| 10,790,092 B2 | 9/2020 | Itamochi | |
| 11,295,895 B2 | 4/2022 | Kirk et al. | |
| 11,621,129 B2 | 4/2023 | Kirk et al. | |
| 2001/0007522 A1 | 7/2001 | Nakagawa et al. | |
| 2006/0087030 A1 * | 4/2006 | Auernheimer | H01G 4/40 |
| | | | 257/E23.079 |
| 2007/0133147 A1 * | 6/2007 | Ritter | H01G 4/232 |
| | | | 361/309 |
| 2008/0165468 A1 * | 7/2008 | Berolini | H01C 7/18 |
| | | | 361/306.3 |
| 2009/0147440 A1 * | 6/2009 | Cygan | H01G 4/38 |
| | | | 361/306.3 |
| 2011/0043963 A1 * | 2/2011 | Bultitude | H01G 2/16 |
| | | | 29/25.42 |
| 2011/0102969 A1 * | 5/2011 | Togashi | H01G 4/232 |
| | | | 29/25.03 |
| 2014/0022692 A1 * | 1/2014 | Yoon | H01G 4/30 |
| | | | 156/322 |
| 2018/0374646 A1 | 12/2018 | Ward et al. | |
| 2020/0111611 A1 * | 4/2020 | Park | H01C 7/1006 |
| 2023/0238186 A1 | 7/2023 | Kirk et al. | |

FOREIGN PATENT DOCUMENTS

| | | | |
|---|---|---|---|
| JP | S 56-78443 | | 6/1981 |
| JP | S 619804 U | | 1/1986 |
| JP | H 02240907 A | | 9/1990 |
| JP | H 02304910 A | | 12/1990 |
| JP | H 03206606 A | | 9/1991 |
| JP | H 0653075 A | | 2/1994 |
| JP | H 07249541 A | | 9/1995 |
| JP | 2767014 B2 | * | 6/1998 |
| JP | H 11204314 A | | 7/1999 |
| JP | 2000299249 A | | 10/2000 |
| JP | 2002064303 A | | 2/2002 |
| JP | 2003188039 A | | 7/2003 |
| JP | 2008021850 A | | 1/2008 |
| JP | 2008100856 A | | 5/2008 |
| JP | 2009200364 A | | 9/2009 |
| JP | 2009222663 A | | 10/2009 |
| JP | 2012164972 A | * | 8/2012 |
| JP | 2016192472 A | * | 11/2016 |
| KR | 20070045656 A | * | 5/2007 |
| KR | 20100066080 A | | 6/2010 |
| KR | 20180122127 A | | 11/2018 |
| WO | WO 2018/043397 A1 | | 3/2018 |

OTHER PUBLICATIONS

Japanese Office Action for JP Application No. 2021-563206 dated Mar. 22, 2024, 11 pages.

* cited by examiner

INTEGRATED COMPONENT INCLUDING A CAPACITOR AND DISCRETE VARISTOR

CROSS REFERENCE TO RELATED APPLICATION

The present application claims filing benefit of U.S. Provisional Patent Application Ser. No. 62/838,410 having a filing date of Apr. 25, 2019, which is incorporated herein by reference in its entirety.

BACKGROUND OF THE SUBJECT MATTER

For some time, the design of various electronic components has been driven by a general industry trend toward miniaturization, as well as increased functionality. In such regard, a need exists for ever smaller electronic components having improved operating characteristics. Some applications would benefit from the equivalent of multiple components, but are severely limited in the amount of space such electronic components may occupy, for example, on a circuit board.

Multilayer ceramic devices, such as multilayer ceramic capacitors or varistors, are sometimes constructed with a plurality of dielectric-electrode layers arranged in a stack. During manufacture, the layers may be pressed and formed into a monolithic stacked structure.

It would be advantageous, therefore, if devices and corresponding method could be provided that result in improved miniaturization, as well as increased functionality and/or operational characteristics.

SUMMARY OF THE SUBJECT MATTER

In accordance with one embodiment of the present invention, an integrated component having capacitor and varistor functionality may include a multilayer capacitor including a first active termination, a second active termination, at least one ground termination, and a pair of capacitors connected in series between the first active termination and the second active termination. The integrated component may include a discrete varistor comprising a first external varistor termination connected with the first active termination and a second external varistor termination connected with the second active termination of the multilayer capacitor.

In accordance with another embodiment of the present invention, a method for forming an integrated component having capacitor and varistor functionality may include providing a multilayer capacitor body including electrodes that form a pair of capacitors; forming a first active termination, a second active termination, and at least one ground termination external to the multilayer capacitor body such that the pair of capacitors are connected in series between the first active termination and the second active termination; and stacking a discrete varistor with the multilayer capacitor body such that a first varistor termination of the discrete varistor is connected with the first active termination and a second varistor termination is connected with the second active termination.

Other features and aspects of the present invention are discussed in greater detail below.

BRIEF DESCRIPTION OF THE DRAWINGS

A full and enabling disclosure of the presently disclosed subject matter, including the best mode thereof, directed to one of ordinary skill in the art, is set forth in the specification, which makes reference to the appended figures, in which.

Figure 1A:
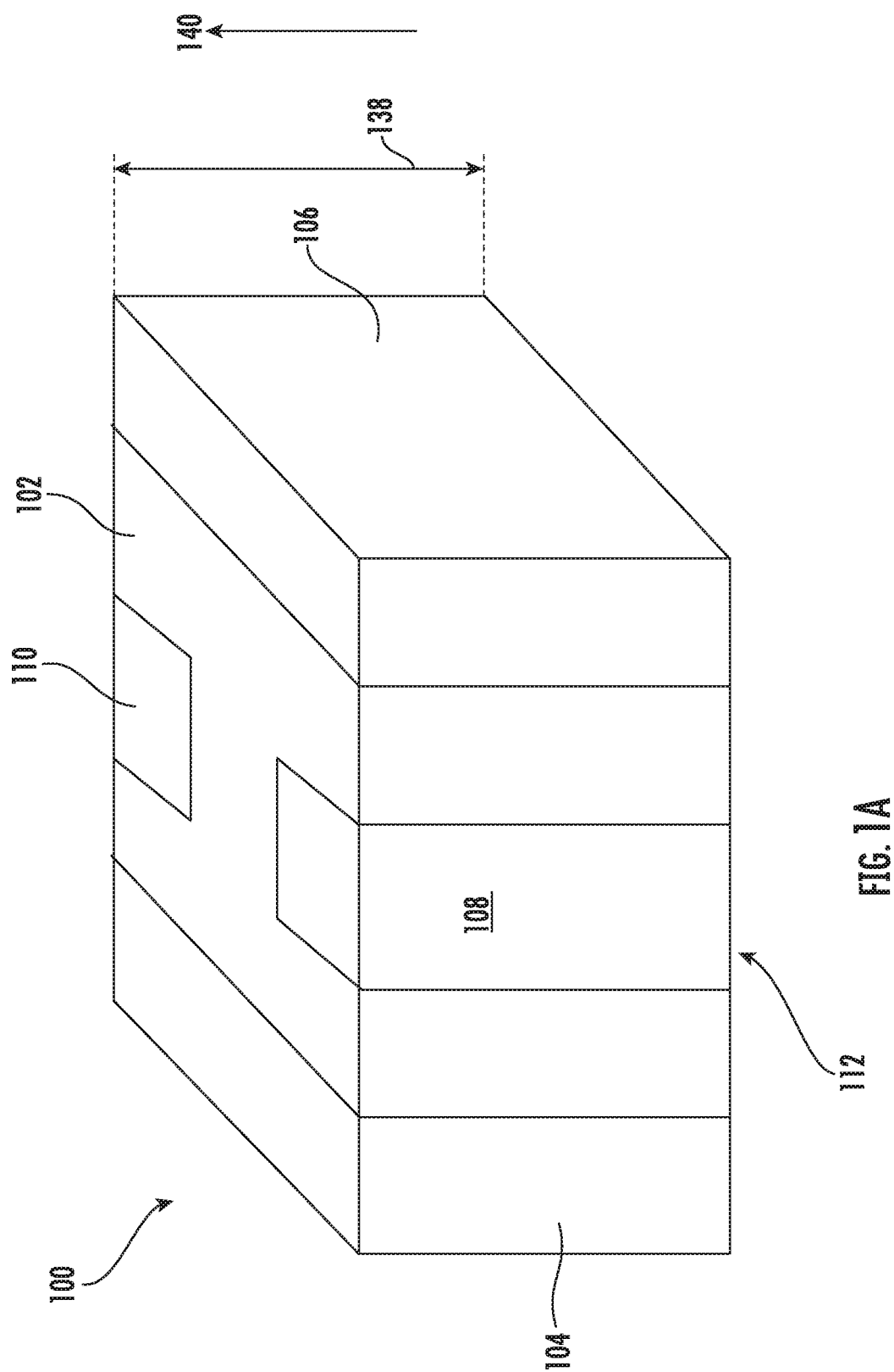
FIG. 1A illustrates an external perspective view of an exemplary embodiment of a multiterminal multilayer device in accordance with presently disclosed subject matter, for use such as for an SMD configuration.

Repeat use of reference characters throughout the present specification and appended drawings is intended to represent same or analogous features, elements, or steps thereof.

DETAILED DESCRIPTION OF THE SUBJECT MATTER

Reference now will be made in detail to various embodiments of the invention, one or more examples of which are set forth below. Each example is provided by way of explanation of the invention, not limitation of the invention. In fact, it will be apparent to those skilled in the art that various modifications and variations may be made in the present invention without departing from the scope or spirit of the invention. For instance, features illustrated or described as part of one embodiment, may be used on another embodiment to yield a still further embodiment. Thus, it is intended that the present invention covers such modifications and variations as come within the scope of the appended claims and their equivalents.

Generally speaking, the present invention is directed to an integrated device including a multilayer capacitor and a discrete varistor. Without intending to be limited by theory, a capacitor is an electrical component that stores electrical energy in an electric field. Without intending to be limited by theory, a varistor is an electrical component that has an electrical resistance that can vary with the applied voltage thereby rendering it a voltage-dependent resistor.

In combination, the capacitor and varistor can provide filtering and EMI and/or EMI/ESD circuit protection in a single package, which may be especially useful when space is limited. The present invention may be particularly suitable for automotive applications, such as motor start-stop applications.

The multilayer capacitor of the integrated component can have a split feedthrough type construction and include a first active termination, a second active termination, and a pair of capacitors connected in series between the first active termination and the second active termination. The capacitors can be formed by internal electrodes separated by dielectric layers.

The discrete varistor can include a first external varistor termination connected with the first active termination and a second external varistor termination connected with the second active termination of the multilayer capacitor. For example, the discrete varistor can multilayer capacitor can be stacked to form a single monolithic integrated component. In some embodiments, leads can be connected with the external terminals and/or the integrated component can be over-molded. Thus, an over-molded layer can encapsulate the discrete varistor and the multilayer capacitor.

The multilayer capacitor can include at least one ground termination located external to the ceramic body. A first plurality of electrode layers may be disposed within the body and connected with the first active termination. A second plurality of electrode layers disposed within the body and connected with the second active termination. A third plurality of electrode layers can be connected with the ground termination(s) and capacitively coupled with each of the first plurality of electrode layers and second plurality of electrode layers to form the split feedthrough type construction. The first capacitor can be formed at a first overlapping area between the first plurality and third plurality of electrode layers. The second capacitor can be formed at a second overlapping area between the second plurality and third plurality of electrode layers.

In one embodiment, the first capacitor may have a first capacitance, and the second capacitor may have a second capacitance. In some embodiments, the first and second overlapping areas may be approximately equal such that the second capacitance may be approximately equal to the first capacitance. In other embodiments, however, the first and second overlapping areas may be different such the first capacitance may be greater than or less than the second capacitance.

For example, at least one of the first capacitance of the second capacitance may range from about 10 nF to about 3 µF, in some embodiments from about 200 nF to about 2 µF, in some embodiments from about 400 nF to about 1.5 µF. The second capacitance may range from about 5% to about 500% of the first capacitance, in some embodiments from about 10% to about 300%, in some embodiments from about 25% to about 200%, and in some embodiments from about 50% to about 150%.

In some embodiments, the third plurality of electrode layers can generally be cross-shaped and can be connected with a pair of opposing ground terminals. For example, the third plurality of electrode layers can each include a pair of opposite edges. One of the opposite edges can be connected with the first ground termination, and the other of the opposite edges can be connected with the second ground termination.

The monolithic body may be free of any additional capacitors formed within the monolithic body. For example, the first, second, and third pluralities of electrodes may be arranged in an electrode stack up that extends through a large portion of a thickness of the monolithic body. For example, a ratio of a thickness of the electrode stack-up to a thickness of the monolithic body may range from about 0.5 to about 0.97, in some embodiments from about 0.6 to about 0.95, and in some embodiments from about 0.7 to about 0.9.

In some embodiments, the component may include one or leads connected with the external terminals. For example, first and second leads may be respectively coupled with the first and second active terminations. A third lead and/or a fourth lead may be coupled with the ground termination(s). The component can be over-molded such that the leads protrude from the over-molded package for connecting the component.

In other embodiments, at least one of the first active termination, the second active termination, or the at least one ground termination may be exposed along a bottom surface of the integrated component for surface mounting the component for example as a surface mount device (SMD) or using grid array type mounting (e.g., land grid array (LGA), ball grid array (BGA), etc.).

Aspects of the present disclosure may simplify assembly and/or mounting of a leaded or SMD component by replacing multiple discrete capacitors with a single integrated capacitive device. For example, in an SMD configuration, multiple discrete components are avoided on a PCB, which saves space on the PCB and, in some instances, lowers inductance and/or equivalent series resistance (ESR). Additionally, the number of solder joints may be reduces, increasing reliability.

In general, the dielectric layers of the multilayer capacitor can be made of any material generally employed in the art. For instance, the dielectric layer can be made of a ceramic material including a titanate as a primary component. The titanate may include but is not limited to, barium titanate ($BaTiO_3$). The ceramic material may also contain an oxide of a rare-earth metal and/or a compound of such acceptor type element as Mn, V, Cr, Mo, Fe, Ni, Cu, Co, or the like. The titanate may also contain MgO, CaO, $Mn_3O_4$, $Y_2O_3$, $V_2O_5$, ZnO, $ZrO_2$, $Nb_2O_5$, $Cr_2O_3$, $Fe_2O_3$, $P_2O_5$, SrO, $Na_2O$, $K_2O$, $Li_2O$, $SiO_2$, $WO_3$ or the like. The ceramic material may also include other additives, organic solvents, plasticizers, binders, dispersing agents, or the like in addition to ceramic powder.

In general, the internal electrodes of the multilayer capacitor can be made of any material generally employed in the art. For instance, the internal electrodes can be formed by sintering a conductive paste whose main component is a noble metal material. These materials can include, but are not limited to, palladium, palladium-silver alloy, nickel, and copper. For instance, in one embodiment, the electrodes may be made of nickel or a nickel alloy. The alloy may contain one or more of Mn, Cr, Co, Al, W and the like, and a Ni content in the alloy is preferably 95% by weight or more. The Ni or Ni alloy may contain 0.1% by weight or less of various micro-amount components such as P, C, Nb, Fe, Cl, B, Li, Na, K, F, S and the like.

The ceramic body of the multilayer capacitor can be formed using any method generally known in the art. For instance, the ceramic body can be formed by forming a laminated body with alternately stacked ceramic sheets and patterned internal electrodes, removing a binder off the laminated body, sintering the binder removed laminated body in a non-oxidative atmosphere at a high temperature ranging from 1200° C. to 1300° C., and re-oxidizing the sintered laminated body in the oxidative atmosphere.

In general, the varistor may be configured to divert electrical surges to ground. For example, the varistor may have a clamping voltage that ranges from about 3 volts to about 150 volts, in some embodiments from about 5 volts to about 100 volts, in some embodiments from about 10 volts to about 50 volts, and in some embodiments from about 15 volts to about 30 volts.

The varistor can include a ceramic body with external electrodes. The ceramic body is fabricated by sintering a laminated body formed of alternately stacked ceramic layers and internal electrodes. Each pair of neighboring internal electrodes faces each other with a ceramic layer therebetween and can be electrically coupled to different external electrodes, respectively.

In general, the dielectric layers may include any suitable dielectric material, such as, for instance, barium titanate, zinc oxide, or any other suitable dielectric material. Various additives may be included in the dielectric material, for example, that produce or enhance the voltage-dependent resistance of the dielectric material. For example, in some embodiments, the additives may include oxides of cobalt, bismuth, manganese, or a combination thereof. In some embodiments, the additives may include oxides of gallium, aluminum, antimony, chromium, boron, titanium, lead, barium, nickel, vanadium, tin, or combinations thereof. The dielectric material may be doped with the additive(s) ranging from about 0.5 mole percent to about 3 mole percent, and in some embodiments from about 1 mole percent to about 2 mole percent. The average grain size of the dielectric material may contribute to the non-linear properties of the dielectric material. In some embodiments, the average grain size may range from about 10 microns to 100 microns, in some embodiments, from about 20 microns to 80 microns. The varistor may also include two terminals, and each electrode may be connected with a respective terminals. Electrodes may provide resistance along the length of the electrodes and/or at the connection between the electrodes and terminals.

In general, the internal electrodes can be made of any material generally employed in the art. For instance, the internal electrodes can be formed by sintering a conductive paste whose main component is a noble metal material. These materials can include, but are not limited to, palladium, palladium-silver alloy, silver, nickel, and copper. For instance, in one embodiment, the electrodes may be made of nickel or a nickel alloy. The alloy may contain one or more of Mn, Cr, Co, Al, W and the like, and a Ni content in the alloy is preferably 95% by weight or more. The Ni or Ni alloy may contain 0.1% by weight or less of various microamount components such as P, C, Nb, Fe, Cl, B, Li, Na, K, F, S and the like.

The integrated component may have a variety of sizes. For example, the integrated component may have a case size ranging from EIA 0504, or smaller to EIA 2920, or larger. Example case sizes include 0805, 1206, 1806, 2020, etc.

As indicated above, in some embodiments, the integrated component may be over-molded using a variety of suitable. Examples include a silicon rubber, a thermoplastic elastomer, or other similar polymer.

Example embodiments will now be discussed with reference to the Figures. FIG. 1A illustrates an external perspective view of an exemplary embodiment of a multi-terminal multilayer device 100 generally in accordance with presently disclosed subject matter. As illustrated, the device 100 may include a body 102, such as a six-sided body. The device 100 may include a first end terminal 104, a second end terminal 106, a first side terminal 108, and a second side terminal 110. All such external terminations present on a designated bottom side 112 generally of device 100, for use such as in a surface mount device (SMD) configuration.

The device 100 may include two formed capacitors in series between the two of the first and second terminals 104, 106. As understood by those of ordinary skill in the art relative to all embodiments described herein, cooperating layers in the subject multilayer constructions comprise electrode layers which in turn form integrated capacitive structures.

Figure 1C:
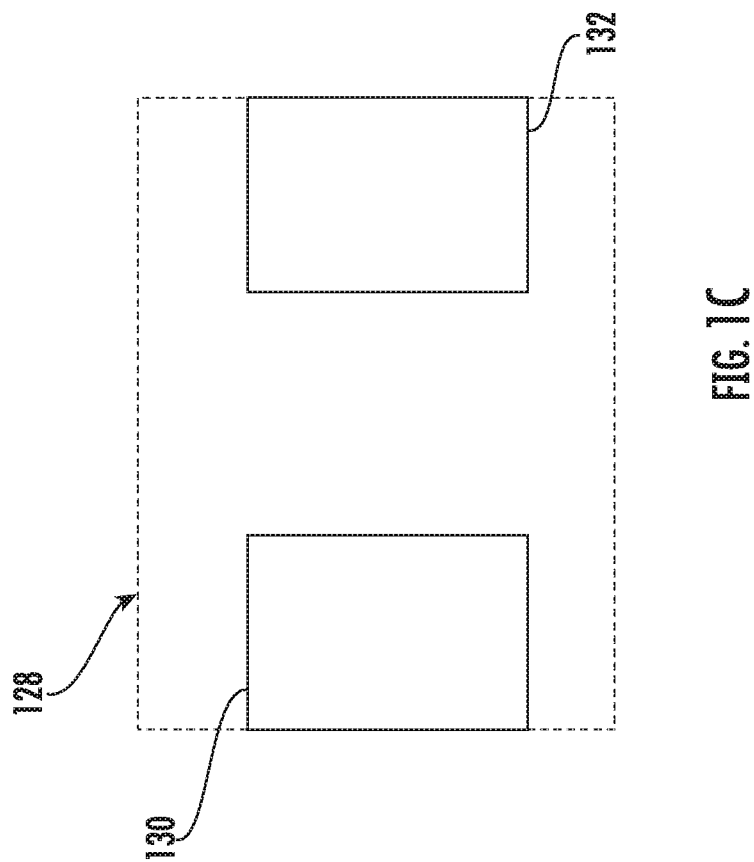
FIG. 1C illustrates a second electrode layer of the device of FIG. 1A.
Figure 1B:
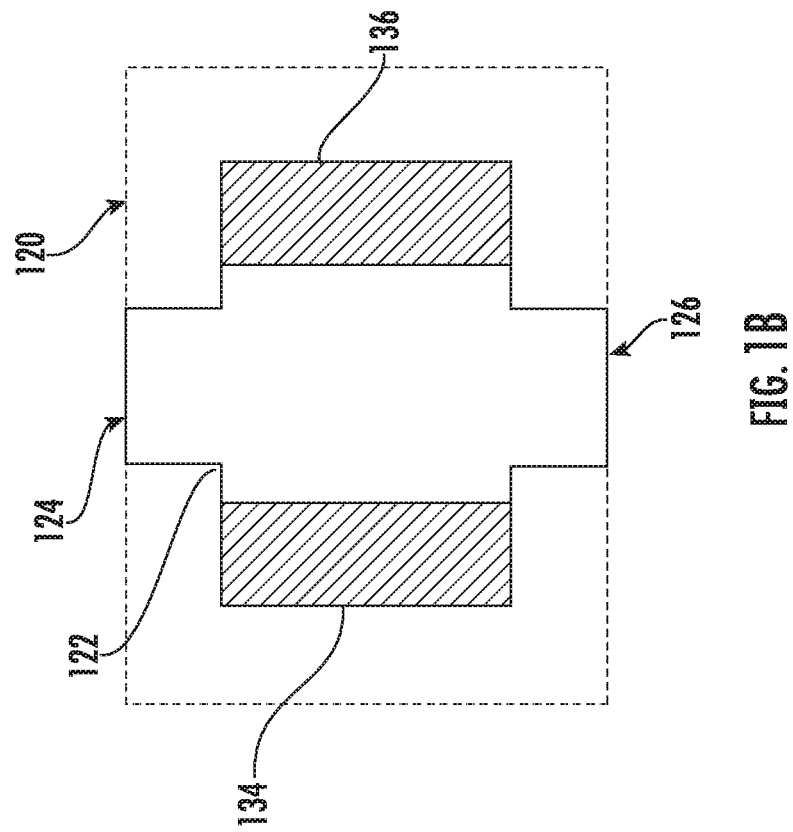
FIG. 1B illustrates a first electrode layer of the device of FIG. 1A.
Figure 1D:
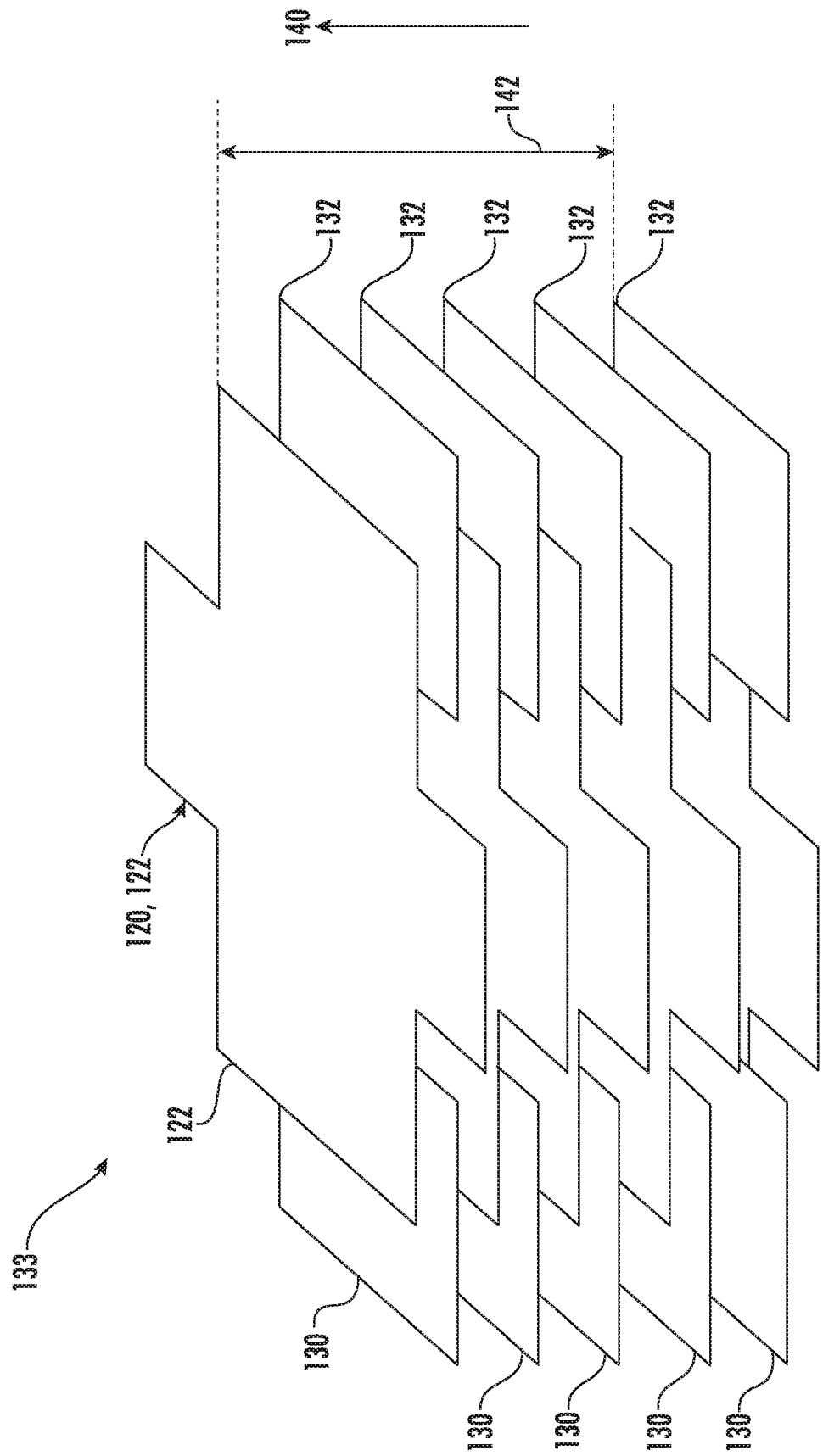
FIG. 1D illustrates a stack-up of alternating first and second electrode layers of the device of FIG. 1A.

FIG. 1B illustrates a first electrode layer 120 of the device 100 of FIG. 1A. The electrode arrangement 120 may include a cross-shaped electrode 122 having a pair of opposite edges 124, 126 respectively connected with the first and second side terminals 108, 110 (FIG. 1A). FIG. 1C illustrates a second electrode layer 128 including a first electrode 130 connected with the first end terminal 104 and a second electrode 132 connected with the second end terminal 106. FIG. 1D illustrates an electrode stack-up 133 of alternating first and second electrode layers 120, 128. It should be understood that the electrode stack-up 133 may include any suitable number of electrode layer 120, 128.

Referring again to FIG. 1B, the cross-shape electrode 122 may overlap with the first electrode 130 along a first overlapping area 134 to form a first capacitor and may overlap with the second electrode 132 along a second overlapping area 136 to form a second capacitor.

In some embodiments, the monolithic body 102 (FIG. 1A) may be free of any additional capacitors (in addition to the first and second capacitors) within the monolithic body 102 (FIG. 1A). For example, the electrode stack-up 133 described above with reference to FIG. 1D may extend through a large portion a thickness 138 of the monolithic body 102 (FIG. 1A) in a Z-direction 140 that is perpendicular to the electrodes 122, 130, 132. For example, a ratio of a thickness 142 of the electrode stack-up 133 in the Z-direction 140 to the thickness 138 of the monolithic body 102 may range from about 0.4 to about 0.97.

Figure 1E:
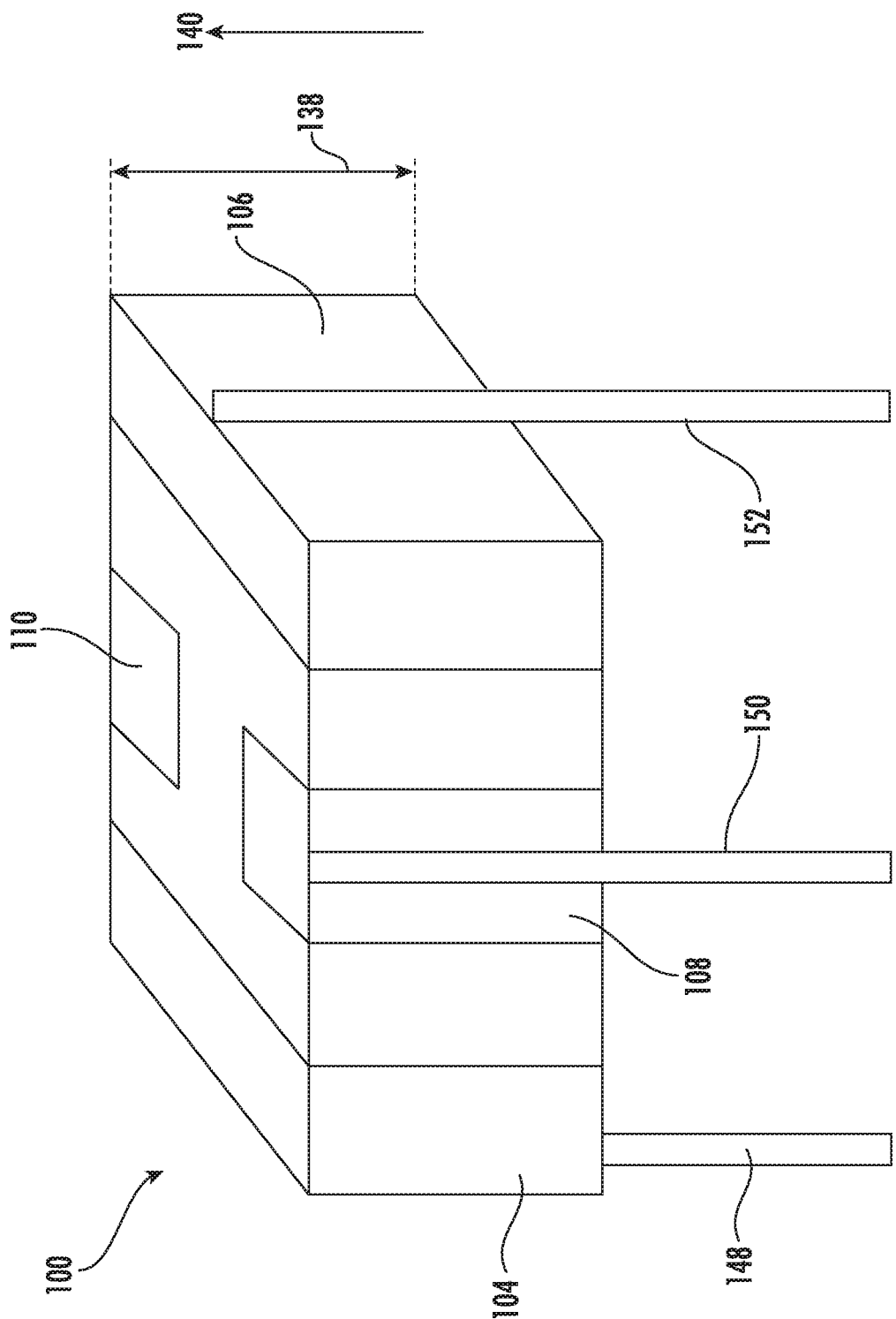
FIG. 1E illustrates the device of FIG. 1A further including leads connected with respective external terminals of the device.

FIG. 1E illustrates a perspective view of another embodiment of a device 100 according to aspects of the present application. FIG. 1A, with added lead configuration. More specifically, leads 148, 150, and 152 are respectively attached to external terminations 104, 108, and 106. Leads 148 and 152 may constitute first and second leads respectively attached to the first pair of terminations 104 and 106, while lead 150 may constitute a third lead attached to at least one of the second pair of terminations 108 and 110. Those of ordinary skill in the art will also understand that terminations 108 and 110 are both connected to layer 122, such that lead 150 may be connected with either such termination 108 or 110 with the same electrical circuitry consequences. The resulting configuration of application FIG. 1C is an over-molded three leaded component.

Figure 1F:
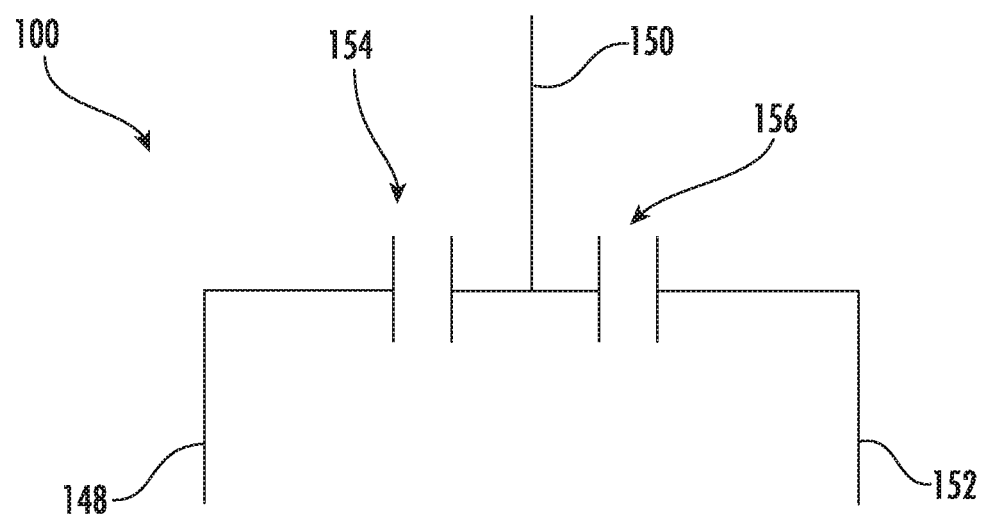
FIG. 1F is a schematic view of the device of FIG. 1A.

FIG. 1F illustrates a schematic view of the device 100 of application FIG. 1A, in the connection/mounting configuration thereof as shown by application FIG. 1E. More specifically, leads 148, 150, and 152 are shown in respective contact with series and parallel capacitors. The indicated capacitance values are intended as exemplary only, rather than limiting.

As illustrated, device 100 provides a single device solution for containing series and parallel capacitors. A first capacitor 154 may be formed between the cross-shaped electrode 122 and the first electrode 130 at the first overlapping area 134. A second capacitor 156 may be formed between the cross-shaped electrode 122 and the second electrode 132 at the second overlapping area 136. The first overlapping area 134 may be approximately equal to the second overlapping area 136 such that the first capacitor and second capacitor exhibit approximately capacitances. In other embodiments, however, however, the first overlapping area 134 may be greater than or less than the second overlapping area 136 such that the first capacitance may be greater than or less than the second capacitance. One or both of the first capacitance and the second capacitance may range from about 10 nF to about 3 µF.

Figure 2B:
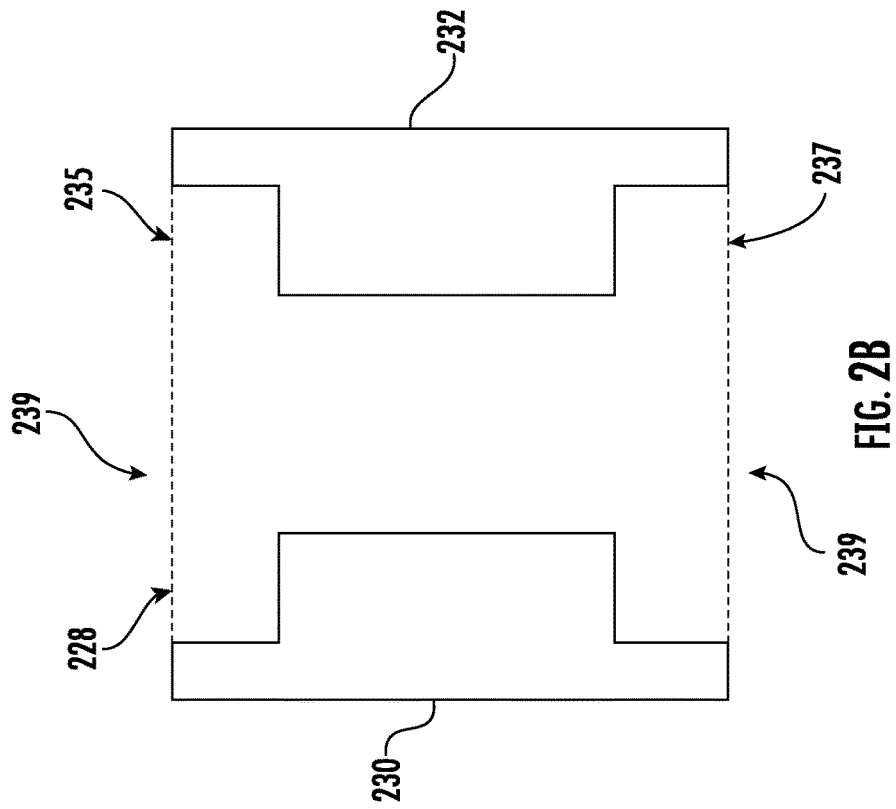
FIGS. 2A and 2B illustrate alternative first and second electrode layers for the device of FIG. 1A in which the second electrode layer include T-electrodes.
Figure 2A:
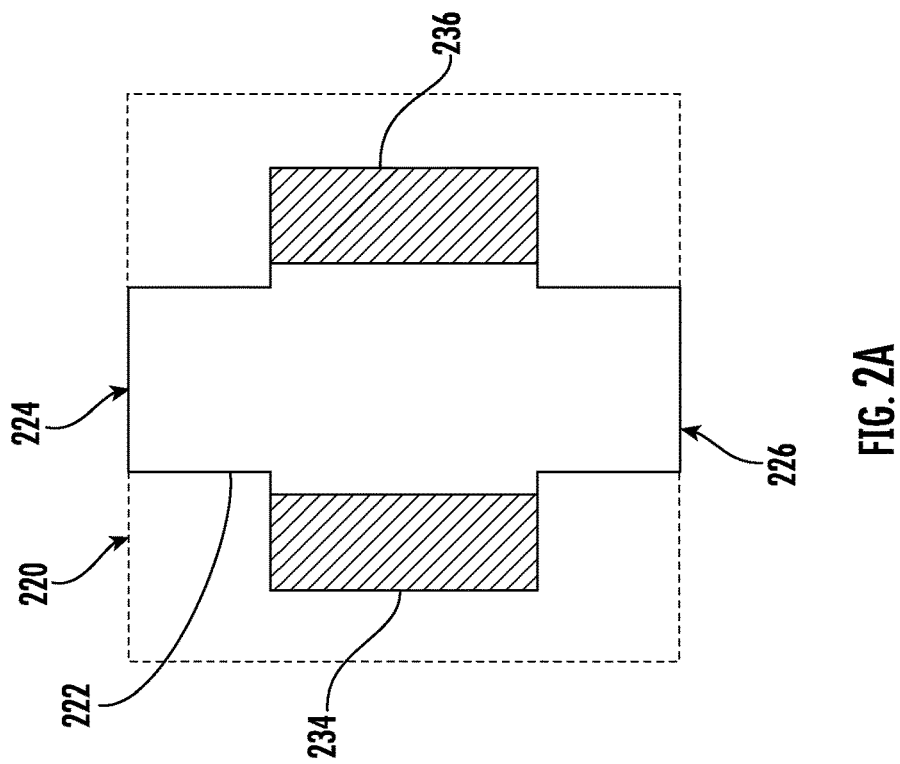

FIGS. 2A and 2B illustrate an electrode configuration of another embodiment according to aspects of the present disclosure. A first electrode layer 220 may include a cross-shaped electrode 222 having a pair of opposite edges 224, 226 that may be respectively connected with the first and second side terminals 108, 110 (FIG. 1A). FIG. 2B illustrates a second electrode layer 228 including a first electrode 230 connected with the first end terminal 104 (FIG. 1A) and a second electrode 232 connected with the second end terminal 106 (FIG. 1A). The first electrode 230 and/or second electrode 232 may be a T-electrode such that the electrode(s) 230, 232 extend to side edges 235, 237 of the electrode layer 228 and connect with respective end terminals 104, 106 (FIG. 1A) along at least one side surface 239 of the monolithic body 102.

Figure 2C:
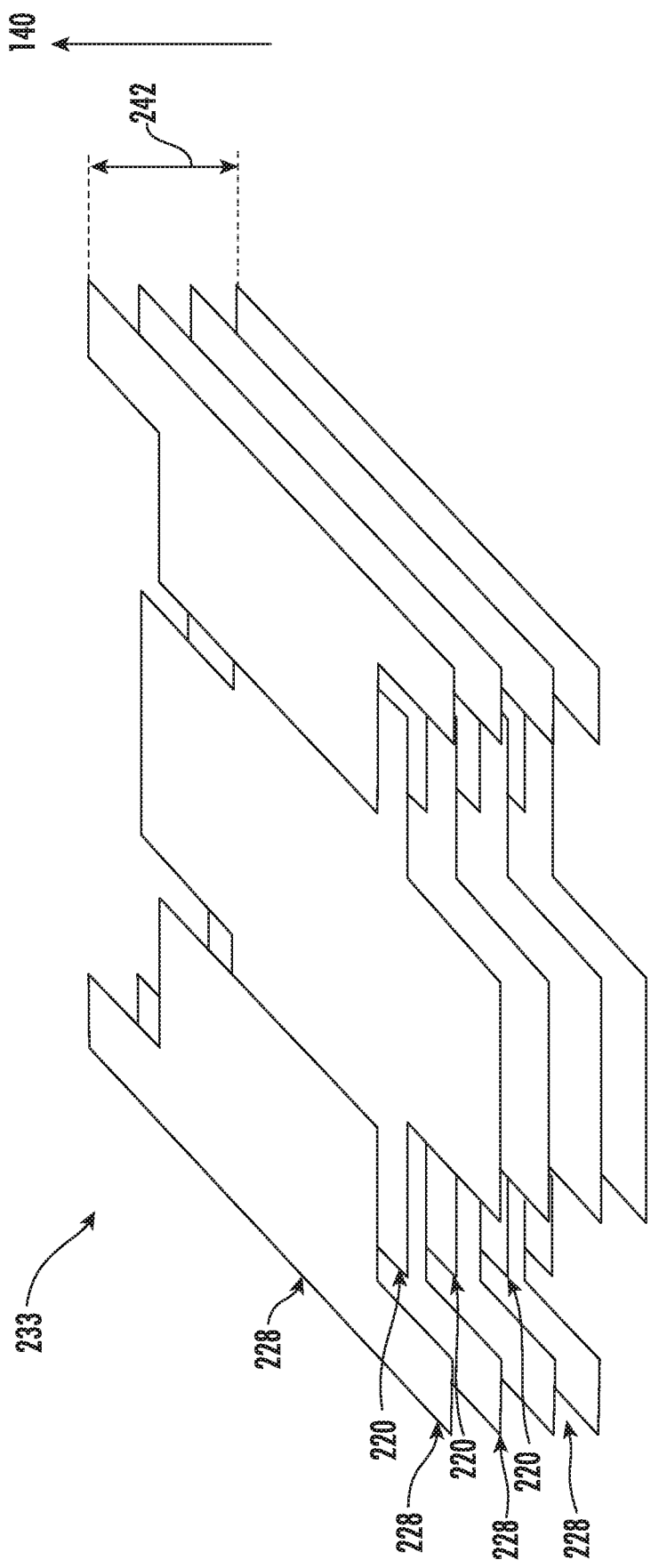
FIG. 2C illustrates a stack-up of alternating first and second electrode layers as shown in FIGS. 2A and 2B.

FIG. 2C illustrates an electrode stack-up 233 of alternating first and second electrode layers 220, 228. The electrode stack-up 233 may have a thickness 242 in the Z-direction 140.

A ratio of the thickness 242 of the electrode stack-up 233 in the Z-direction 140 to the thickness 138 of the monolithic body 102 (FIG. 1A) may range from about 0.4 to about 0.97.

Referring again to FIG. 2A, the cross-shape electrode 222 may overlap with the first electrode 230 along a first overlapping area 234 and may overlap with the second electrode 232 along a second overlapping area 236.

Figure 3A:
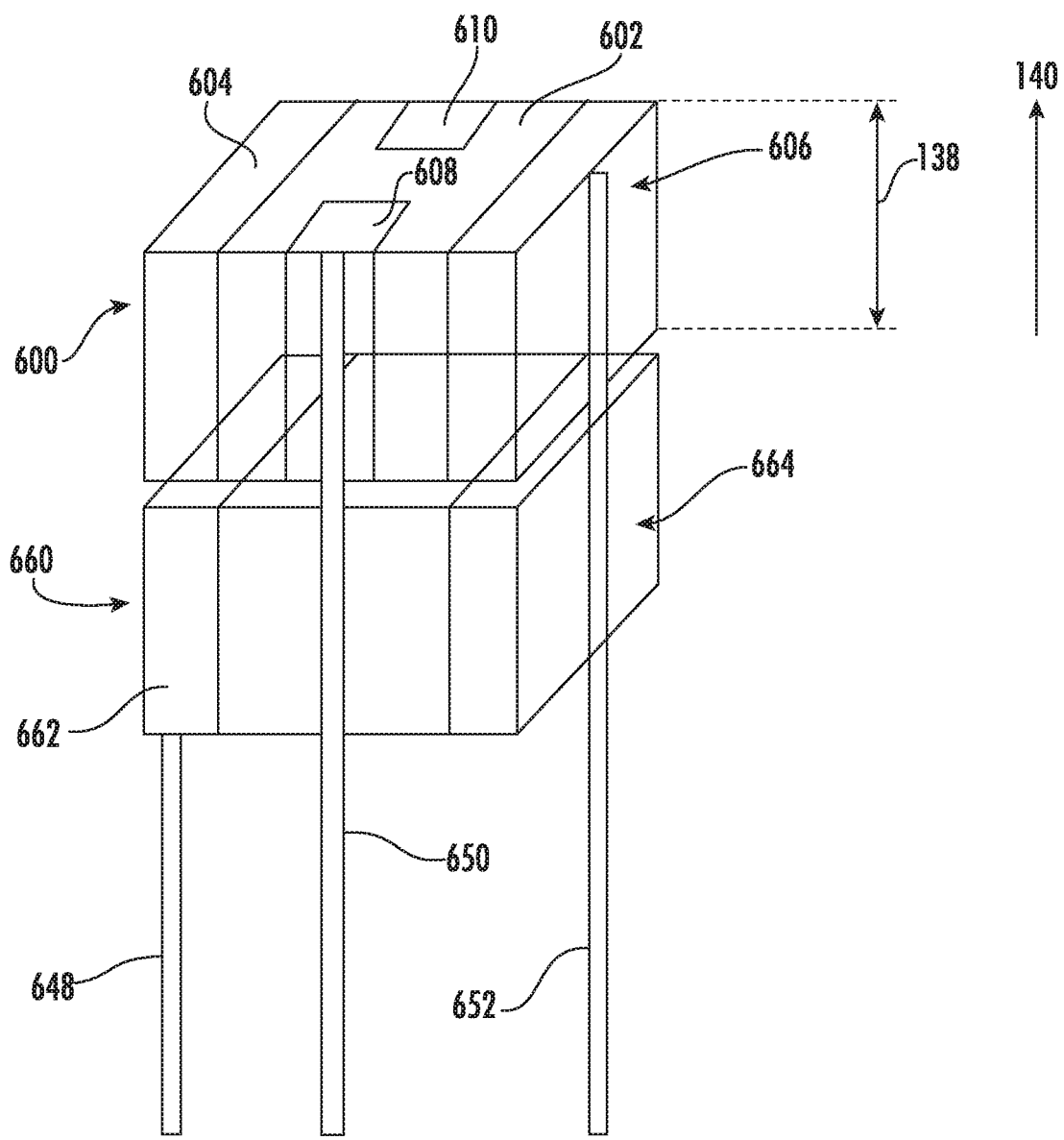
FIG. 3A illustrates an integrated component including a multilayer capacitor and discrete varistor in a stacked configuration in accordance with presently disclosed subject matter.
Figure 3B:
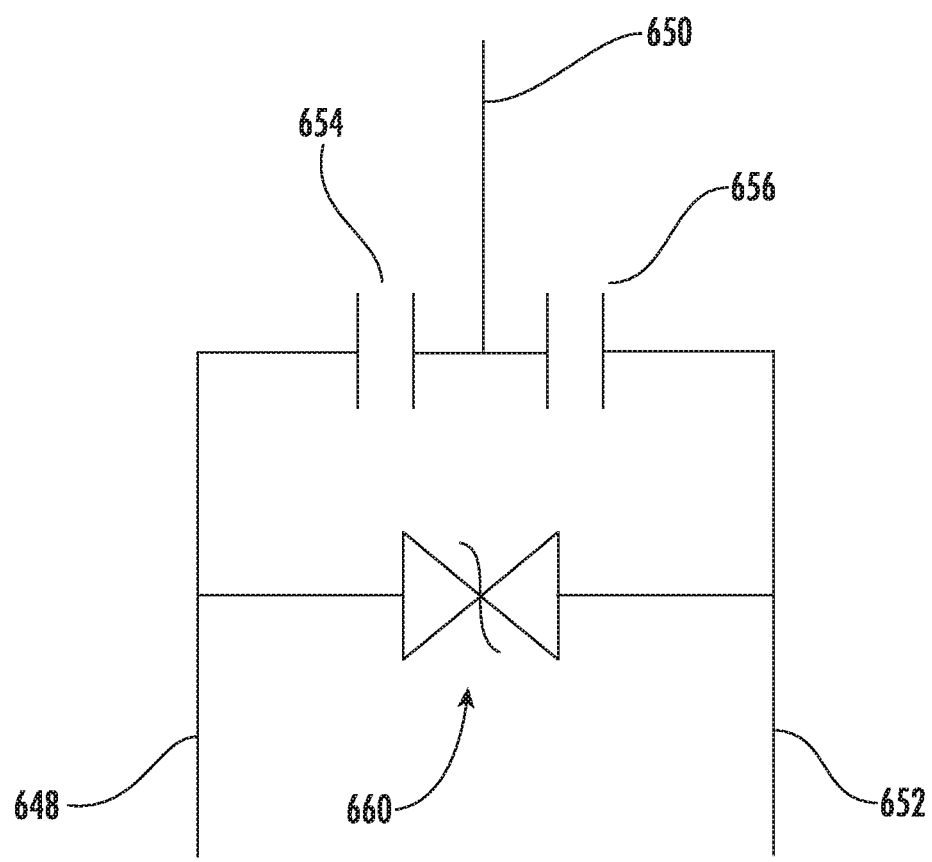
FIG. 3B a schematic view of the device of FIG. 3A.

FIG. 3A illustrates an external perspective view of an exemplary embodiment of a multiterminal multilayer device 600 generally in accordance with presently disclosed subject matter, for use in a stacked configuration with a varistor device 660 with respective added leads 648, 650, and 652, as illustrated. As discussed further herein, FIG. 3B illustrates a schematic view of the exemplary embodiment 600 of application FIG. 3A. As shown, the device 600 may be configured similarly to the device 100 described above, including a body 602, such as a six-sided body, as well as a first end terminal 604, a second end terminal 606, a first side terminal 608, and a second side terminal 610.

A varistor 660 may have external varistor terminations 662, 664. A lead configuration arrangement may be used to place device 600 and varistor 660 in parallel relative to each other. More specifically, leads 648, 650, and 652 may be respectively attached to external (capacitor device) terminations 604, 608, and 606 of device 600, while leads 648 and 652 and respectively connected as shown to external side (varistor) terminations 662 and 664 of varistor 660. The resulting configuration of application FIG. 3A may be over-molded.

FIG. 3B illustrates a schematic view of the exemplary embodiment 600 generally of application FIG. 3A, in the connection/mounting configuration thereof as shown by application FIG. 3A. More specifically, leads 648, 650, and 652 are shown in respective contact with series and parallel capacitors. The indicated capacitance values are intended as exemplary only, rather than limiting. Varistor 660 is likewise in contact with leads 648 and 652 as illustrated, so as to be in parallel relationship with device 600. The indicated varistor characteristics are intended as exemplary only, rather than limiting.

Figure 3C:
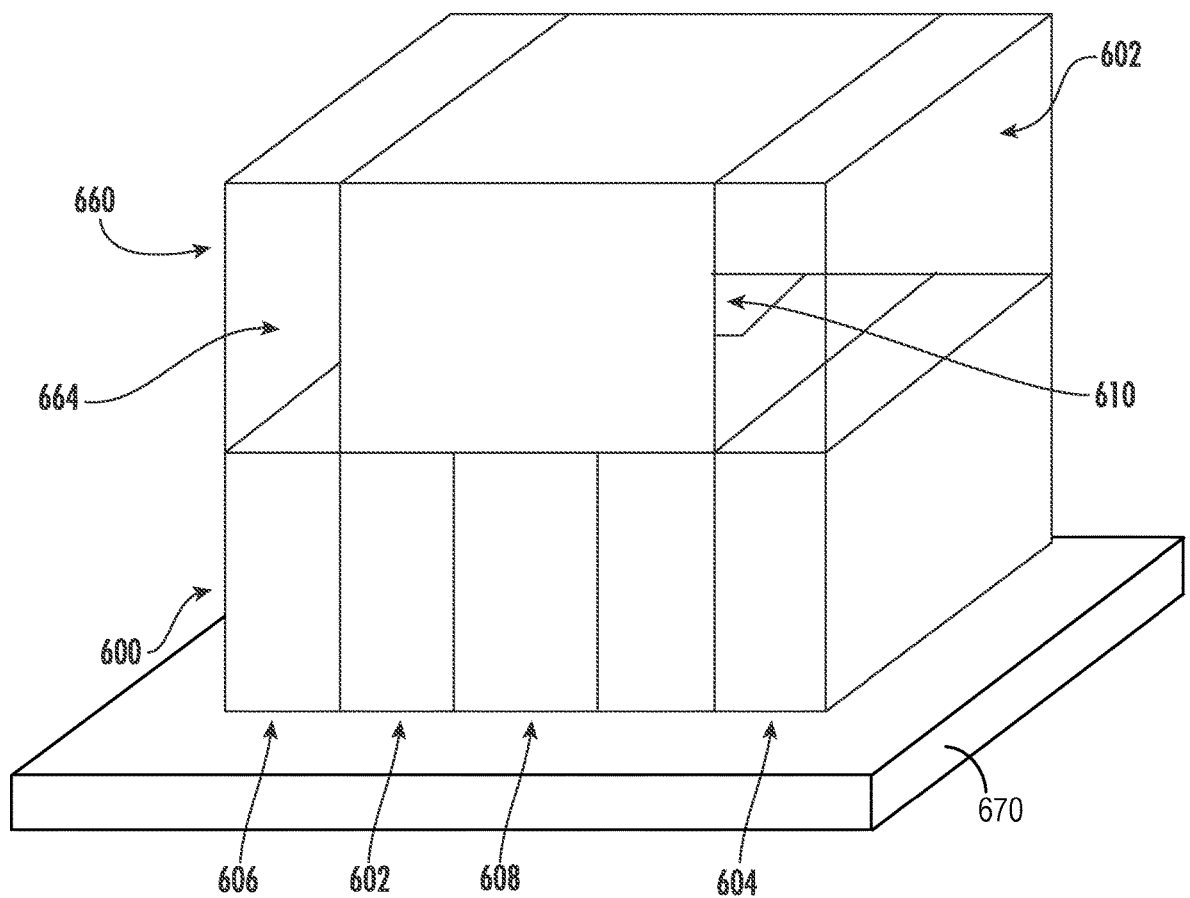
FIG. 3C illustrates an external perspective view of another embodiment of an integrated component, in accordance with presently disclosed subject matter.

FIG. 3C illustrates a perspective view of integrated component having capacitor and varistor functionality according to aspects of the present disclosure. In general, FIG. 3C illustrates the device of FIG. 3A in another perspective. For instance, the embodiment of FIG. 3C provides device 600, such as a multilayer ceramic device, on bottom with varistor 660 on top. Such a configuration can allow for mounting on a mounting surface 670, e.g., for use as a surface mount device after combining, such as via soldering, device 600 and varistor 660 together. Additionally, the embodiment as illustrated in FIG. 3C is provided without the leads illustrated in FIG. 3A. However, it should be understood that leads may also be employed when in such a configuration.

As illustrated, device 600 provides a single device solution for containing series and parallel capacitors. Device 600 shows two representative capacitors 654 and 656, such as may be formed by a split feedthrough configuration of multiple layers in an isolated region of device 600.

While various sizes may be practiced for any of the exemplary embodiments disclosed herewith, device 600 and varistor 660 may be regarded as being representative of a standard MLC case size, for example, a 1206 case size. Of course, various sizes may be practiced in various embodiments, as needed or desired for a particular application. All such variations and variations of exemplary capacitance values are intended to come with the spirit and scope of the presently disclosed subject matter.

As shown by the disclosure herewith, for some embodiments where used in an SMD arrangement, the presently disclosed subject matter may result in replacement of multiple discrete components on a printed circuit board (PCB), thereby saving space and, in some instances, lowering inductance. All of such presently disclosed exemplary embodiments may in some uses thereof by packaged in over-molded three leaded components. Per presently disclosed subject matter, a substantial reduction in device size is obtained, which results in reduction in the number of solder joints, which correspondingly increases reliability.

Figure 4:
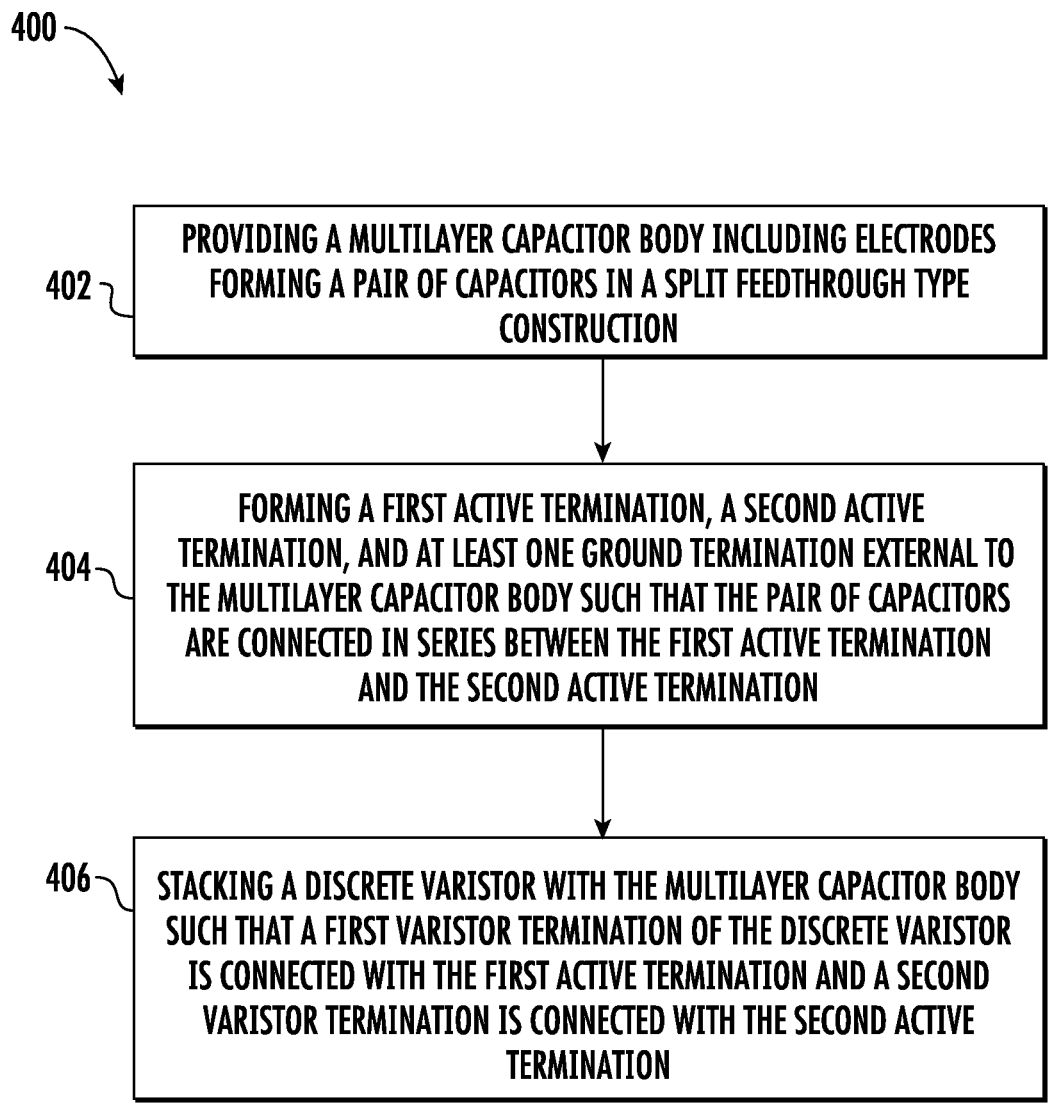
FIG. 4 is a flowchart of a method for forming an integrated component having capacitor and varistor functionality according to aspects of the present disclosure.

FIG. 4 is a flowchart of a method 400 for forming an integrated component having capacitor and varistor functionality according to aspects of the present disclosure. In general, the method 400 will be described herein with reference to the integrated components 100, 200 described above with reference to FIGS. 1A through 3C. However, it should be appreciated that the disclosed method 400 may be implemented with any suitable integrated component. In addition, although FIG. 4 depicts steps performed in a particular order for purposes of illustration and discussion, the methods discussed herein are not limited to any particular order or arrangement. One skilled in the art, using the disclosures provided herein, will appreciate that various steps of the methods disclosed herein can be omitted, rearranged, combined, and/or adapted in various ways without deviating from the scope of the present disclosure.

The method 400 may include, at (402), providing a multilayer capacitor body including electrodes that form a pair of capacitors in a split feedthrough type construction, for example as described above with reference to FIGS. 1A through 3C.

The method may include, at (404) forming a first active termination and a second active termination external to the multilayer capacitor body such that the pair of capacitors are connected in series between the first active termination and the second active termination, for example as described above with reference to FIGS. 1A through 3C.

The method may include, at (406) stacking a discrete varistor with the multilayer capacitor body such that a first varistor termination of the discrete varistor is connected with the first active termination and a second varistor termination is connected with the second active termination.

It should be understood that individual steps in achieving the disclosed configurations are only intended as representative thereof, and do not denote required use of other aspects beyond the general nature of the disclosure otherwise indicated. For example, those of ordinary skill in the art will recognize that selected steps may be practiced to produce a particular design selected for a given application of the presently disclosed subject matter.

Examples

According to one example embodiment of the present disclosure, an integrated component has first and second capacitors that each exhibit about 475 nF. The integrated component includes a discrete varistor having a clamping voltage of about 22 volts.

According to one example embodiment of the present disclosure, an integrated component has first and second capacitors that each exhibit about 685 nF. The integrated component includes a discrete varistor having a clamping voltage of about 22 volts.

According to another example embodiment of the present disclosure, an integrated component has first and second capacitors that each exhibit about 1 µF. The integrated component includes a discrete varistor having a clamping voltage of about 22 volts.

Test Methods

The following sections provide example methods for testing varistors to determine various characteristics of the multilayer ceramic capacitor, discrete capacitor, and/or integrated component.

The clamping voltage of the varistor may be measured using a Keithley 2400 series Source Measure Unit (SMU), for example, a Keithley 2410-C SMU. The varistor may be subjected to an 8/20 µs current wave, for example according to ANSI Standard C62.1. The current wave may have a peak current value of 1 mA. The peak current value may be selected such that the peak current causes the varistor to "clamp" the voltage. The current may increase to the peak current value and then decay. A "rise" time period may be from the initiation of the current pulse to when the current reaches 90% of the peak current value. The "rise" time may be 8 µs. The "decay time" may be from the initiation of the current pulse to 50% of the peak current value. The "decay time" may be 20 µs. The clamping voltage measured as the maximum voltage across the varistor during the current wave.

The capacitance(s) of the multilayer capacitor may be measured using a Keithley 2400 series Source Measure Unit (SMU), for example, a Keithley 2410-C SMU. For example, the first capacitance of the first capacitor may be measured between ground and the first external terminal of the multilayer capacitor. The second capacitance of the second capacitor may be measured between ground and the second external terminal of the multilayer capacitor.

While such presently disclosed subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the presently disclosed subject matter as would be readily apparent to one of ordinary skill in the art.

What is claimed is:

1. An integrated component comprising:
   a multilayer capacitor having a top surface, a bottom surface opposite the top surface, a first end surface, a second end surface opposite the first end surface, a first side surface, and a second side surface opposite the first side surface, the multilayer capacitor comprising a first active termination, a second active termination, at least one ground termination, and a pair of capacitors connected in series between the first active termination and the second active termination, the multilayer capacitor further comprising:
      a body comprising a plurality of dielectric layers;
      a first plurality of electrode layers disposed within the body and connected with the first active termination;
      a second plurality of electrode layers disposed within the body and connected with the second active termination; and
      a third plurality of electrode layers connected with the at least one ground termination and capacitively coupled with each of the first plurality of electrode layers and second plurality of electrode layers to form a first capacitor of the pair of capacitors between the first plurality and third plurality of electrode layers and a second capacitor of the pair of capacitors between the second plurality and third plurality of electrode layers;
   a discrete varistor comprising a first external varistor termination connected with the first active termination and a second external varistor termination connected with the second active termination of the multilayer capacitor, the discrete varistor having a clamping voltage within a range of about 15 volts to about 30 volts;
   a first lead attached to the first active termination and the first external varistor termination;
   a second lead attached to the second active termination and the second external varistor termination; and
   a third lead attached to the at least one ground termination,
   wherein at least one of the first plurality of electrode layers or the second plurality of electrode layers is connected with a respective one of the first active termination or the second active termination along the first side surface, the second side surface, and a respective one of the first end surface or the second end surface,
   wherein the third plurality of electrode layers overlap with the first plurality of electrode layers along a first overlapping area, and
   wherein the third plurality of electrode layers overlap with the second plurality of electrode layers along a second overlapping area that is different from the first overlapping area such that the first capacitor of the pair of capacitors has a first capacitance and the second capacitor of the pair of capacitors has a second capacitance that is different from the first capacitance.

2. The integrated component of claim 1, wherein the third plurality of electrode layers are generally cross-shaped.

3. The integrated component of claim 1, wherein the at least one ground termination comprises a first ground termination and a second ground termination.

4. The integrated component of claim 3, wherein each of the third plurality of electrode layers comprises a pair of opposite edges, one of the opposite edges connected with the first ground termination and the other of the opposite edges connected with the second ground termination.

5. The integrated component of claim 3, wherein the first ground termination is located opposite the second ground termination.

6. The integrated component of claim 1, wherein the first, second, and third leads are respectively attached to the first active and first external varistor terminations, the second active and second external varistor terminations, and the at least one ground termination such that the first, second, and third leads extend perpendicular to the first plurality of electrode layers and the second plurality of electrode layers.

7. The integrated component of claim 1, wherein at least one of the first capacitance or the second capacitance ranges from about 475 nF to about 3 µF.

8. The integrated component of claim 1, wherein the discrete varistor is stacked relative to the multilayer capacitor.

9. The integrated component of claim 8, further comprising an over-molded layer encapsulating the discrete varistor and the multilayer capacitor.

10. The integrated component of claim 1, wherein a ratio of a thickness of the electrode stack-up to a thickness of the body is within a range of about 0.95 to about 0.97.

11. A method for forming an integrated component comprising:
    providing a multilayer capacitor body including electrodes that form a first capacitor and a second capacitor, the multilayer capacitor body having a top surface, a bottom surface opposite the top surface, a first end surface, a second end surface opposite the first end surface, a first side surface, and a second side surface opposite the first side surface, wherein providing the multilayer capacitor body including electrodes forming the first capacitor and the second capacitor comprises:
        forming a plurality of dielectric layers;
        forming a first plurality of electrode layers disposed within the multilayer capacitor body; and
        forming a second plurality of electrode layers disposed within the multilayer capacitor body;
    forming a first active termination, a second active termination, and at least one ground termination external to the multilayer capacitor body, the first plurality of electrode layers connected with the first active termination and the second plurality of electrode layers connected with the second active termination such that the first capacitor and the second capacitor are connected in series between the first active termination and the second active termination;
    stacking a discrete varistor with the multilayer capacitor body such that a first varistor termination of the discrete varistor is connected with the first active termination and a second varistor termination is connected with the second active termination; and
    attaching a first lead to the first active termination and the first varistor termination, a second lead to the second active termination and the second varistor termination, and a third lead to the at least one ground termination,
    wherein at least one of the first plurality of electrode layers or the second plurality of electrode layers is connected with a respective one of the first active termination or the second active termination along the first side surface, the second side surface, and a respective one of the first end surface or the second end surface,
    wherein the first capacitor has a first capacitance and the second capacitor has a second capacitance,
    wherein at least one of the first capacitance or the second capacitance ranges from about 475 nF to about 3 µF, and
    wherein the plurality of dielectric layers, the first plurality of electrode layers, and the second plurality of electrode layers are stacked to form an electrode stack-up and a ratio of a thickness of the electrode stack-up to a thickness of the body is within a range of about 0.95 to about 0.97.

12. The method of claim 11, further comprising:
    forming a third plurality of electrode layers within the multilayer capacitor body connected with the at least one ground termination and capacitively coupled with each of the first plurality of electrode layers and the second plurality of electrode layers to form the first capacitor between the first plurality of electrode layers and the third plurality of electrode layers and the second capacitor between the second plurality of electrode layers and the third plurality of electrode layers.

13. The method of claim 12, wherein forming the at least one ground termination comprises forming a first ground termination and a second ground termination.

14. The method of claim 12, wherein the third plurality of electrode layers are generally cross-shaped.

15. The method of claim 12, wherein each of the third plurality of electrode layers comprises a pair of opposite edges, one of the opposite edges connected with the first ground termination and the other of the opposite edges connected with the second ground termination.

16. The method of claim 12, wherein:
    the third plurality of electrode layers overlap with the first plurality of electrode layers along a first overlapping area; and
    the third plurality of electrode layers overlap with the second plurality of electrode layers along a second overlapping area that is different from the first overlapping area such that the second capacitance is different from the first capacitance.

17. The method of claim 12, wherein:
    the third plurality of electrode layers overlap with the first plurality of electrode layers along a first overlapping area; and
    the third plurality of electrode layers overlap with the second plurality of electrode layers along a second overlapping area that is approximately equal to the first overlapping area.

18. The method of claim 11, wherein the first, second, and third leads are respectively attached to the first active and first varistor terminations, the second active and second varistor terminations, and the at least one ground termination such that each of the first, second, and third leads extends perpendicular to the first plurality of electrode layers and the second plurality of electrode layers.

19. The method of claim 11, further comprising over-molding the discrete varistor and the multilayer capacitor body with an over-molded layer.

20. The method of claim 11, wherein the discrete varistor has a clamping voltage within a range of about 15 volts to about 30 volts.

21. An integrated component comprising:
    a multilayer capacitor comprising a body, a first active termination, a second active termination, at least one ground termination, and a pair of capacitors in the body, the pair of capacitors connected in series between the first active termination and the second active termination, the multilayer capacitor further comprising:

a first plurality of electrode layers disposed within the body and connected with the first active termination;

a second plurality of electrode layers disposed within the body and connected with the second active termination; and a third plurality of electrode layers connected with the at least one ground termination and capacitively coupled with each of the first plurality of electrode layers and second plurality of electrode layers to form a first capacitor of the pair of capacitors between the first plurality and third plurality of electrode layers and a second capacitor of the pair of capacitors between the second plurality and third plurality of electrode layers; and a discrete varistor comprising a first external varistor termination connected with the first active termination and a second external varistor termination connected with the second active termination of the multilayer capacitor, wherein the discrete varistor is positioned on a top surface of the multilayer capacitor and is connected with the first and second active terminations at the top surface of the multilayer capacitor, wherein at least one of the first active termination, the second active termination, or the at least one ground termination is exposed along a bottom surface of the multilayer capacitor, the bottom surface opposite the top surface, wherein the discrete varistor has a clamping voltage within a range of about 15 volts to about 30 volts, wherein the third plurality of electrode layers overlap with the first plurality of electrode layers along a first overlapping area, and wherein the third plurality of electrode layers overlap with the second plurality of electrode layers along a second overlapping area that is different from the first overlapping area such that the first capacitor of the pair of capacitors has a first capacitance and the second capacitor of the pair of capacitors has a second capacitance that is different from the first capacitance.

22. The integrated component of claim 21, wherein the integrated component is configured to be mounted on a mounting surface using grid array type mounting.

23. The integrated component of claim 21, wherein at least one of the first capacitance or the second capacitance ranges from about 475 nF to about 3 µF, wherein the pair of capacitors of the multilayer capacitor further comprises a plurality of dielectric layers, wherein the plurality of dielectric layers and the plurality of electrode layers form an electrode stack-up, and wherein a ratio of a thickness of the electrode stack-up to a thickness of the body of the multilayer capacitor is within a range of about 0.95 to about 0.97.

24. The integrated component of claim 21, wherein each second electrode layer includes a first electrode connected with the first active termination and a second electrode co-planar with the first electrode and connected with the second active termination, and wherein the plurality of first electrode layers are alternatingly stacked with the plurality of second electrode layers in the body of the multilayer capacitor.

* * * * *